United States Patent
Iacob (10) Patent No.: US 7,279,921 B1
(45) Date of Patent: Oct. 9, 2007

(54) APPARATUS AND METHOD FOR TESTING POWER AND GROUND PINS ON A SEMICONDUCTOR INTEGRATED CIRCUIT

(75) Inventor: Alin Theodor Iacob, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 310 days.

(21) Appl. No.: 11/148,465

(22) Filed: Jun. 8, 2005

(51) Int. Cl.
*G01R 31/26* (2006.01)
*G01R 31/02* (2006.01)

(52) U.S. Cl. .................................. 324/765; 324/537

(58) Field of Classification Search ............... 324/500, 324/512, 522, 527, 537, 765, 763, 158.1
See application file for complete search history.

(56) References Cited

U.S. PATENT DOCUMENTS 5,696,451 A * 12/1997 Keirn et al. ................ 324/687
6,545,497 B2    4/2003 Hebert et al.
6,937,006 B2 *  8/2005 West ........................ 324/158.1
7,053,637 B2 *  5/2006 Whitten et al. ............. 324/754

* cited by examiner

*Primary Examiner*—Ha Tran Nguyen
*Assistant Examiner*—Tung X. Nguyen
(74) *Attorney, Agent, or Firm*—Beyer Weaver LLP (57) ABSTRACT

To achieve the foregoing, and in accordance with the purpose of the present invention, a method and apparatus for testing individual power and ground pins on a semiconductor integrated circuit are disclosed. The method and apparatus includes organizing the power pins of the die into a first group of power pins and a second group of power pins. Each of the first group of power pins are then connected through a first set of resistors to a first common node, and each of the second group of power pins through a second set of resistors to a second common node respectively. A voltage is next applied between the first and second nodes. The voltage at each of the first group of pins is compared with a first threshold voltage and the voltage at each of the second group of pins is compared with a second threshold voltage. Individual bad pins in the first and second groups are identified based on the comparison.

13 Claims, 6 Drawing Sheets

APPARATUS AND METHOD FOR TESTING POWER AND GROUND PINS ON A SEMICONDUCTOR INTEGRATED CIRCUIT

FIELD OF THE INVENTION

The present invention relates generally to the testing of semiconductor integrated circuits, and more particularly, to a method and apparatus for testing individual power and ground pins on a semiconductor integrated circuit.

BACKGROUND OF THE INVENTION

Semiconductor chips are typically fabricated in wafer form. Using well known semiconductor fabrication techniques, a wafer undergoes a series of processing steps, such as deposition, masking, etching, implanting, doping, metallization, etc. to form complex integrated circuits on individual dice on the wafer. Currently, several hundred or even thousands of dice may be fabricated on a single wafer.

Semiconductor vendors want to make sure the devices they sell are operational before shipping the product to a customer. The customer expects the product to be not only operational upon receipt, but also will not fail in the field or operate outside of specifications in extreme conditions, such as severe heat or cold. Accordingly, after a wafer is fabricated, the individual die will undergo a number of tests. Initially, while still in wafer form, the individual dice will be electrically tested using a probe. Non-operational dice are marked with an ink and mapped. After the wafer is singulated, the bad dice are discarded while the good dice are packaged. Lead frames are commonly used in the packaging of semiconductor dice. With this type of packaging procedure, the die is placed onto a lead frame, wire bonded, and then encapsulated in a molding material.

Wiring bonding involves the "stitching" of a thin conductive wire, such as gold, between a contact pad on the die and the lead finger of the lead frame. To form a wire bond, a bonding machine forms a small ball at the end of the wire. The ball is then placed in contact with the pad. A combination of heat, pressure, and vibration causes a bond to form between the ball and the pad. A similar process is typically formed between the other end of the wire and the lead frame finger, thereby forming an electrical connection between the pad on the integrated circuit and the lead frame finger. On a typical die, the stitching process is repeated for each pad and lead frame finger pair of the package.

While the formation of wire bonds has been practiced for a long time in the semiconductor industry, the process is still plagued with a number of problems. Often a poor wire bond will be formed at the junction of the bond pad and the ball at the end of the wire for a number of reasons. The stitching machine may misalign the position of the ball relative to the pad, resulting in a poor bond. Other problems may also result if too much pressure is applied during the stitching process, causing damage to the underlying silicon, if or too little pressure is applied, resulting in a poor connection. Similar problems of misalignment, too much, or too little pressure, can also occur on the connection between the lead frame and the wire. In addition, contaminants on the lead frame can also result in the formation of a poor bond between the lead frame finger and wire.

Problems may also occur with the wires themselves. Due to poor integrity, the wires may break. The wires can also be damaged during the mold encapsulation process. During the encapsulation process, a lead frame with a number of die attached thereon is placed into a mold. Molding material in liquid form is then injected into the mold under pressure. During the injection process, the wires may be adversely affected, damaging the integrity of the electrical connections or causing the wire bonds to touch one another. Also during the curing of the molding material, pressure is exerted onto the wires, which may cause the wires to break, tear off at either the bond pad or lead frame, or contact one another.

Given all the potential problems with the wire bond process, many semiconductor companies have developed tests to visually and electrically test the integrity of the wire bonds of semiconductor chips. For example, after a die has been encapsulated, it will often be exposed to an X-ray. The X-ray image allows a visual inspection of wire bonds of the package. The problem with X-rays is that the image is not always clear, and the manual process of inspecting the devices is slow and imprecise. In a known electrical test method, individual signal pins on the device are checked by making use of the existing ESD circuitry on the device. A small amount of current is provided "backwards" to a VSS pin adjacent the signal pin. The current is used to forward bias the diode coupled between the signal pin and the VSS pin. If a current is detected at the signal pin, it indicates that the bond wire is intact and operative.

Complex semiconductor chips often have hundreds if not thousands of pins. Of these, approximately ten to thirty percent are dedicated to provide power to the circuitry on the chip. Power is provided to the chip through a plurality of pins. The power is then typically distributed throughout a chip using several power distribution grids. On a given chip for example, there will typically be a separate distribution grid for core ground (VSS), core power (VDD), Input/Output ground (VSS I/O), and Input/Output power (VDD I/O), each having a plurality of pins to provide power to the grids respectively. For example, the National Semiconductor NDV8611 DVD processor chip has eight (8) core ground (VSS) pins, eight (8) core power (VDD) pins, nineteen (19) VSS I/O pins, and nineteen (19) VDD I/O pins. The remaining pins on the device are signal pins.

Currently there is no known way to electrically test the integrity of individual power and ground pins on a semiconductor device. A method and apparatus for testing individual power and ground pins on a semiconductor integrated circuit is therefore needed.

SUMMARY OF THE INVENTION

To achieve the foregoing, and in accordance with the purpose of the present invention, a method and apparatus for testing individual power and ground pins on a semiconductor integrated circuit are disclosed. The method and apparatus includes organizing the power pins of the die into a first group of power pins and a second group of power pins. Each of the first group of power pins are then connected through a first set of resistors to a first common node and each of the second group of power pins are connected through a second set of resistors to a second common node respectively. A voltage is applied between the first and second nodes. The voltage at each of the first group of pins is compared with a first threshold voltage and the voltage at each of the second group of pins is compared with a second threshold voltage. Individual bad pins in the first and second groups are identified based on the comparison.

BRIEF DESCRIPTION OF THE DRAWINGS

The invention, together with further advantages thereof, may best be understood by reference to the following description taken in conjunction with the accompanying drawings in which.

In the Figures, like reference numbers refer to like components and elements.

DETAILED DESCRIPTION OF THE INVENTION

Figure 1:
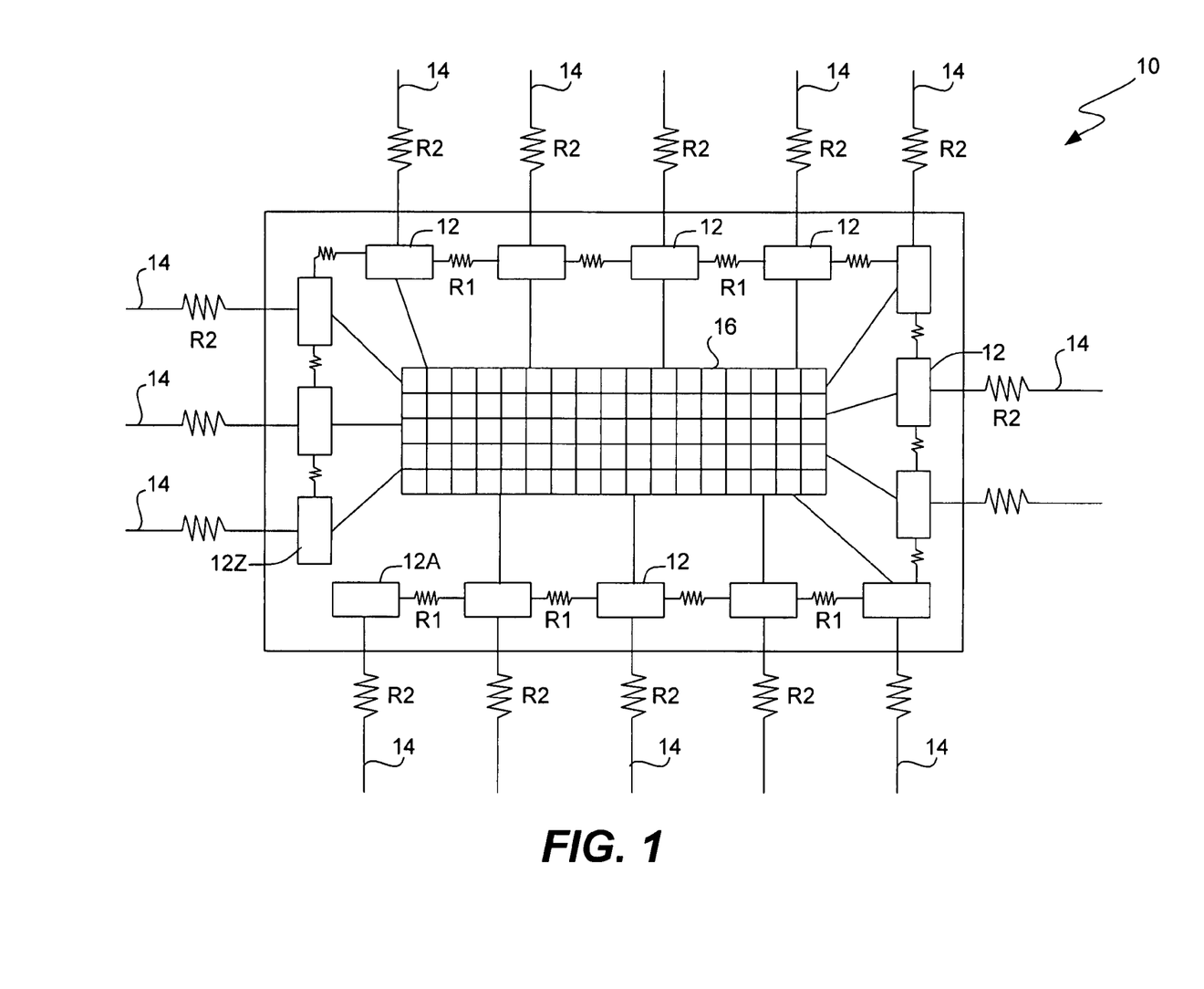
FIG. 1 is a diagram of a power distribution grid and power pins of a semiconductor die.

Referring to FIG. 1, a diagram of a distribution grid and pins of a semiconductor die is shown. The die 10 includes a plurality of bond pads 12 generally arranged around the perimeter of the die 10. Since the bond pads 12 provide power to the die 10, they are formed from the same metallization layer and are electrically coupled together, except for the first bond pad designated 12A and the last bond pad 12Z in the ring. The metal interconnect between each adjacent pair of bond pads 12 is represented by a resistor having a value R1. Each bond pad 12 is also coupled to a bond wire 14 having a resistance designated by R2. The bond wires 14 are formed between the bond pads 12 and pins or leads (not shown) of a lead frame respectively. The wire bonds 14 provide a voltage applied to the pins from an external source to the bond pads 12. The voltage is then distributed to the circuitry on the die 10 through the distribution grid 16. It should be noted that the die 10 as shown is representative and should not be construed as limiting the invention in any way. The number of bond pads 12 and bond wires 14 shown is merely illustrative. On an actual die, the number of bond pads and bond wires may be more or less than illustrated. It also should be understood that the bond pads 12 and distribution grid 16 as shown is "generic" in the sense that it can be used to provide VSS, VDD, VSS I/O, or VDD I/O to the distribution grid 16. Generally speaking, most die will have four sets of bond pads 12, wire bonds 14, and distribution networks 16, one for each power supply VSS, VDD, VSS I/O, or VDD I/O respectively. In alternative embodiments, the first bond pad 12A and the last bond pad 12Z may be connected, forming a complete ring. The present invention can be implemented using either a broken ring of bond pads 12 as illustrated or with a completed ring with all the bond pads 12 electrically connected.

Figure 2:
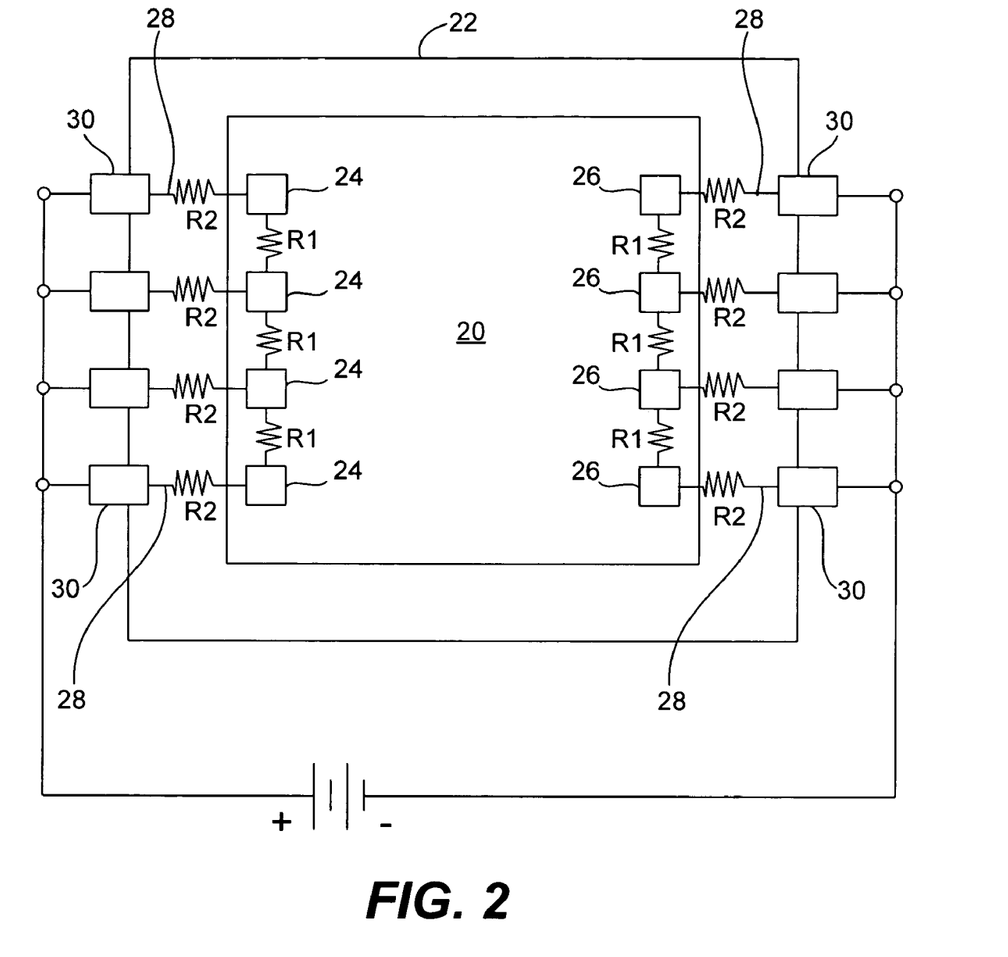
FIG. 2 is a diagram for testing a plurality of power pins on a semiconductor die.

Referring to FIG. 2, a diagram for testing a plurality of power and ground pins on a semiconductor die is shown. A die 20 encapsulated in a package 22 includes a first set of VDD bond pads 24 and a second set of VSS bond pads 26. The first set of bond pads 24 are each electrically coupled to one another by a metal trace having a resistance designated as R1. Similarly, the second set of bond pads 26 are electrically coupled together by a metal trace, also designated by a resistance R1. Bond wires 28 having a resistance R2 are used to couple each of the bond pads 24 and 26 to the external pins 30 of the package 22 respectively.

To test the integrity of the bond wires 28, a positive voltage is applied to the pins 30 coupled to the VDD bond pads 24 and the pins 30 coupled to the VSS bond pads 26 are connected to ground. If all the bond wires 28 are intact, the supply voltage VDD and ground voltage VSS will be evenly applied across the VSS and VDD distribution grids (not shown) respectively. If there is a problem with one or more of the bond wires 28, the voltage level in the area local to the bad bond wire 28 may vary from specification. A varying power supply may cause circuitry on the chip to operate improperly. With the arrangement shown in FIG. 2, however, there is no way to detect if one or more of the wire bonds 28 are damaged or are otherwise defective. Only if all the VSS I/O or VDD I/O pins are damaged would it be possible to determine that there was a problem with these power pins. This is a very unlikely scenario. Nevertheless, the aforementioned testing process is useful because the overall functionality of the chip may be tested and evaluated. If the power is not being properly distributed across the chip, the circuitry on the device may not operate properly.

Figure 3:
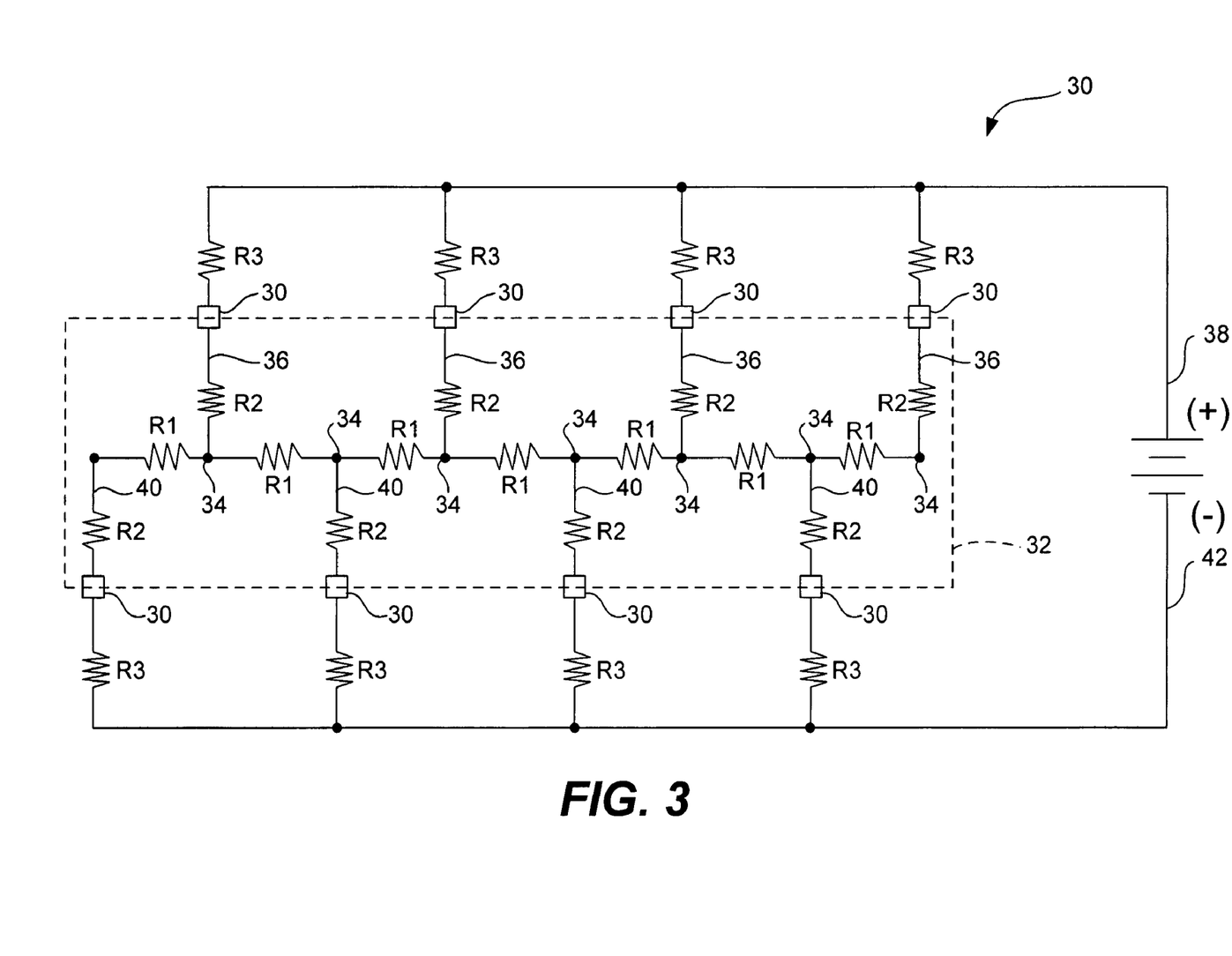
FIG. 3 is a diagram for testing individual power pins on a semiconductor die according to the present invention.

Referring to FIG. 3, a circuit diagram 30 for a test apparatus capable of testing individual power and ground pins on a semiconductor device is shown. The semiconductor device 32 is designated by a "cross-hatched box" that contains in this example a total of eight (8) power supply bond pads 34 (illustrated as nodes) which are electrically coupled together, as designated by resistors R1. The bond wires and corresponding pins 30 are organized into two groups. The first group of bond wires 36 and corresponding pins 30 are coupled to a first node 38. The second group of bond wires 40 and corresponding pins 30 are coupled to a second node 42. The resistance of the bond wires 36, 40 and their corresponding pins 30 are designated by resistors R2. A resistor R3 is provided between each of the first group of pins 30 and the first node 38 of the power supply. Similarly, a resistor R3 is also coupled between each of the second set of pins 30 and the second node 42 of the power supply. The value of resistors R3 is significantly larger than the resistance values of R1 and R2. For example in one embodiment, R1 may have a value ranging from 0.5 to 3.0 Ohms, R2 may range from 0.5 to 0.9 Ohms, while the value of R3 is 22 Ohms. It should be noted that this value of R3 is only exemplary. A resistor with a larger or smaller value may be used.

Figure 4A:
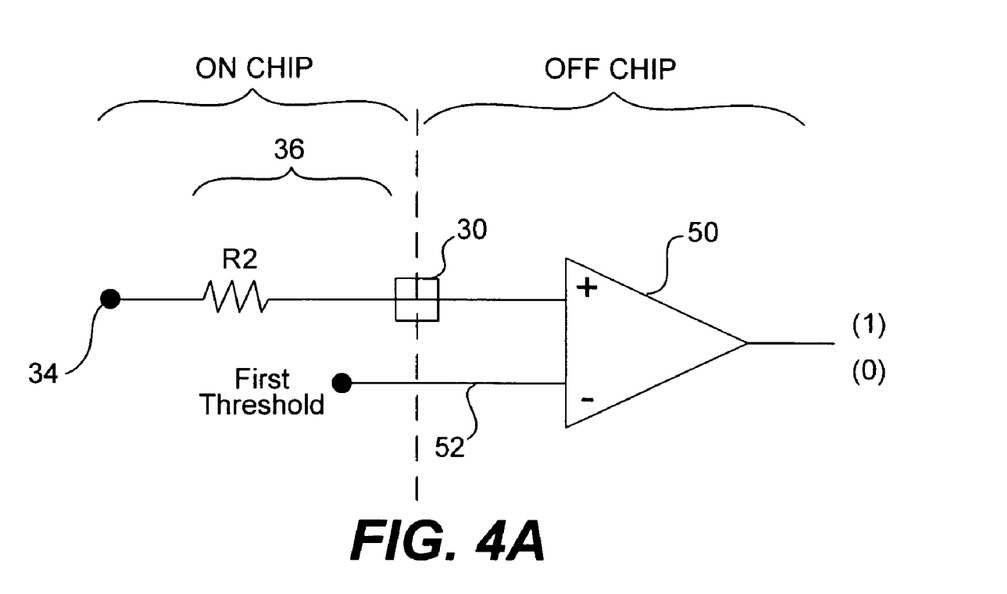
FIGS. 4A and 4B are comparison circuits for testing the individual power pins on a semiconductor die according to the present invention.
Figure 4B:
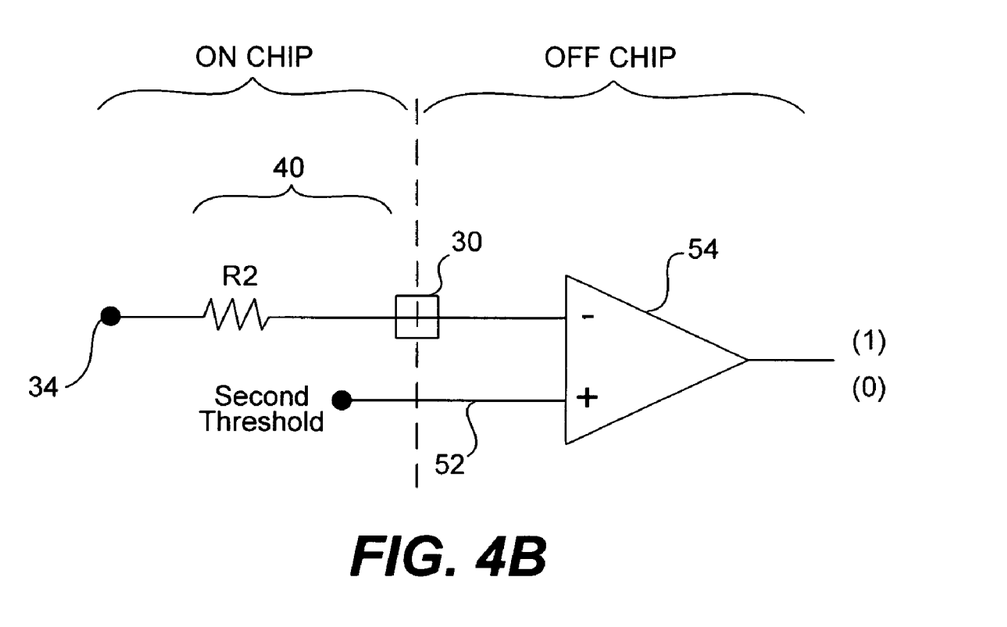

FIGS. 4A and 4B are comparison circuits for testing the individual wire bonds and pins on a semiconductor die according to the present invention. With regard to FIG. 4A, a comparator 50 is shown. One of the bond wires 36 designated by the resistor R2 is coupled to the positive input (+) of the comparator through pin 30. The negative input (−) of the comparator 50 is coupled to a first threshold voltage 52. With regard to FIG. 4B, a comparator 54 is shown. One of the bond wires 40 designated by the resistor R2 is coupled to the negative input (−) of the comparator 54 through pin 30 while the positive (+) input is coupled to a second threshold. It should be understood that each of the bond wires 36 of the first group and each of the bond wires 40 of the second group are coupled to a separate comparator 50 and 54 respectively. However, for the sake of simplicity, only one comparator 50 and one comparator 54 are shown.

During operation, a non-destructive voltage, such as 500 millivolts, is applied across the first terminal 38 and the second terminal 42 of the power supply. If there is no problem with a bond wire 36, then the positive input (+) of the corresponding comparator 50 will be less than the first threshold voltage because there will be a large voltage drop across the external resistor R3. On the other hand, if there is a problem, there will be little to no voltage drop across the bond wire 36. As a result, the voltage of the positive (+) input of the comparator will be greater than the first threshold voltage, indicating there is a problem with the wire bond 36. This comparator test is applied to each of the wires 36. In this manner, the integrity of each of the bond wires 36 of the first group can be tested.

With the second group of bond wires 40, the complement of the above occurs. The voltage at the nodes 34 will be approximately 250 millivolts, or approximately half that applied at the first terminal 38. If a bond wire 40 is damaged, then resistor R3 will pull the pin 30 down to ground. As a result, the negative input of comparator 54 will be less than the second threshold, indicating a problem with the bond wire. On the other hand, if the bond wire 40 is intact, the pin 30 will be at a potential only slightly lower than the 250 milli-volts. The negative input of the comparator 54 will be higher than the second threshold, indicating that there is no problem with the wire bond 40.

Figure 5A:
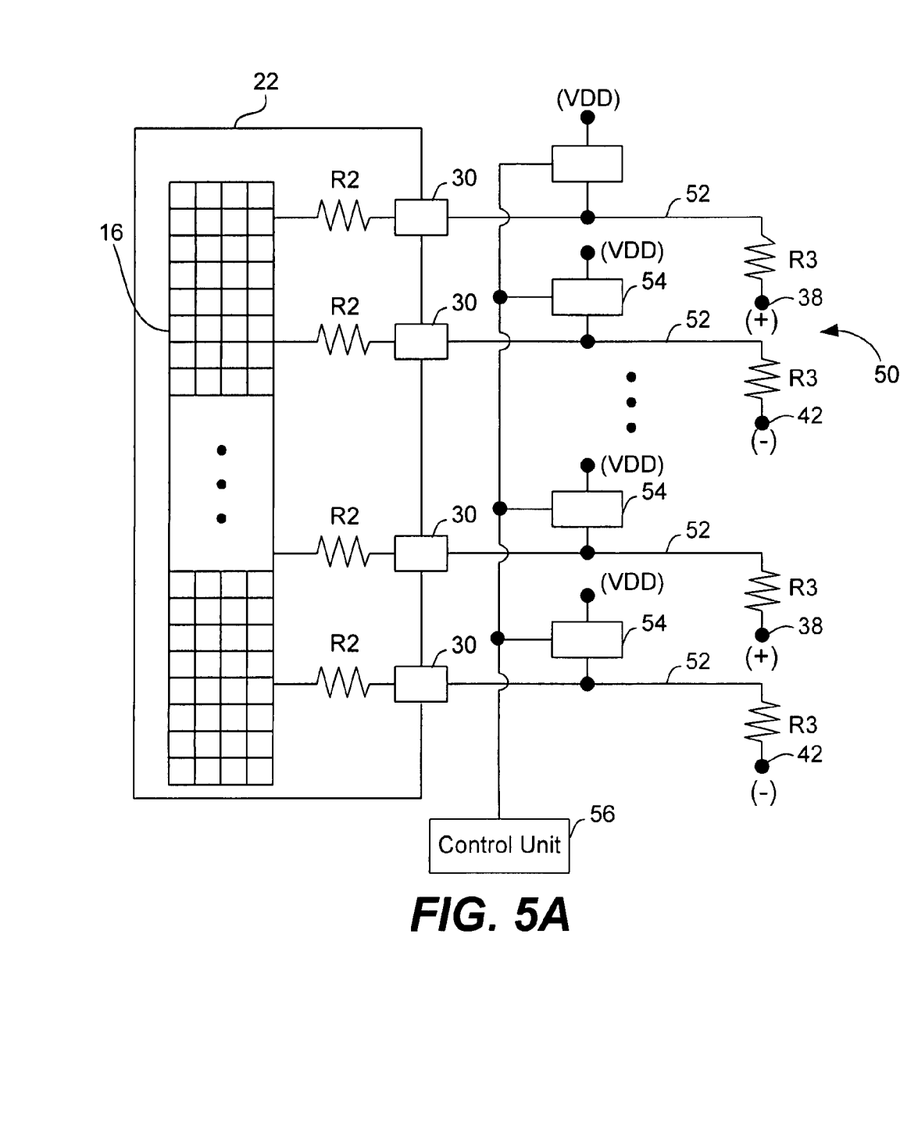
FIGS. 5A and 5B are diagrams of a test apparatus capable of implementing the test circuits of both FIGS. 2 and 3 for positive supply pins VDD, VDDIO and/or VCC according to the present invention.

FIG. 5A is a diagram of a test apparatus 50 capable of performing both standard electrical testing of a chip as implemented by the circuitry of FIG. 2 as well as implementing the circuitry of FIG. 3 to facilitate the testing of individual bond wires on a chip for positive supplies (either VDD or VDD I/O). A plurality of pins 30 are provided around the periphery of the chip for providing power to the grid 16. A bond wire, designated by resistor R2, is provided between each bond pad 30 and the grid 16. A plurality of electrical conductors 52 and switches 54 are coupled to each pin 30. A control unit 56 is used to control the switches 54 respectively. When the control unit 56 activates the switches 54, each conductor 54 is pulled up to the supply voltage VDD. The chip can subsequently undergo normal or standard electrical testing as illustrated and described above in relation to FIG. 2.

When testing the individual bond wires (i.e., to implement the circuitry of FIG. 3), the control unit 56 turns off all the switches 54. Consequently each conductor 52 is connected to either the first terminal 38 or the second terminal 42 through resistor R3. In this manner, the circuit diagram 30 of FIG. 3 is implement when the switches 54 are off. The bond wires R2 associated with each pin 30 can then be tested as described above.

Figure 5B:
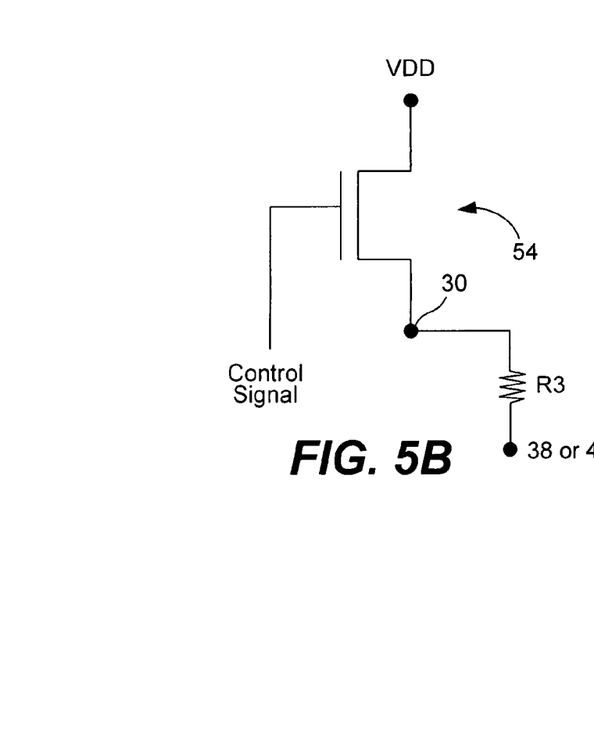

Referring to FIG. 5B, a diagram of the switches 54 is illustrated. Each switch is a transistor having one electrode coupled to VDD and the other connected to a pin 30. The gate of the transistor is coupled to the control signal generated by the control unit 56. When the switch 54 is activated, the transistor turns on, pulling the pin 30 to VDD. When the switch is off, the pin 30 is connected to either the first terminal 38 or the second terminal 42 through the resistor R3.

Figure 6A:
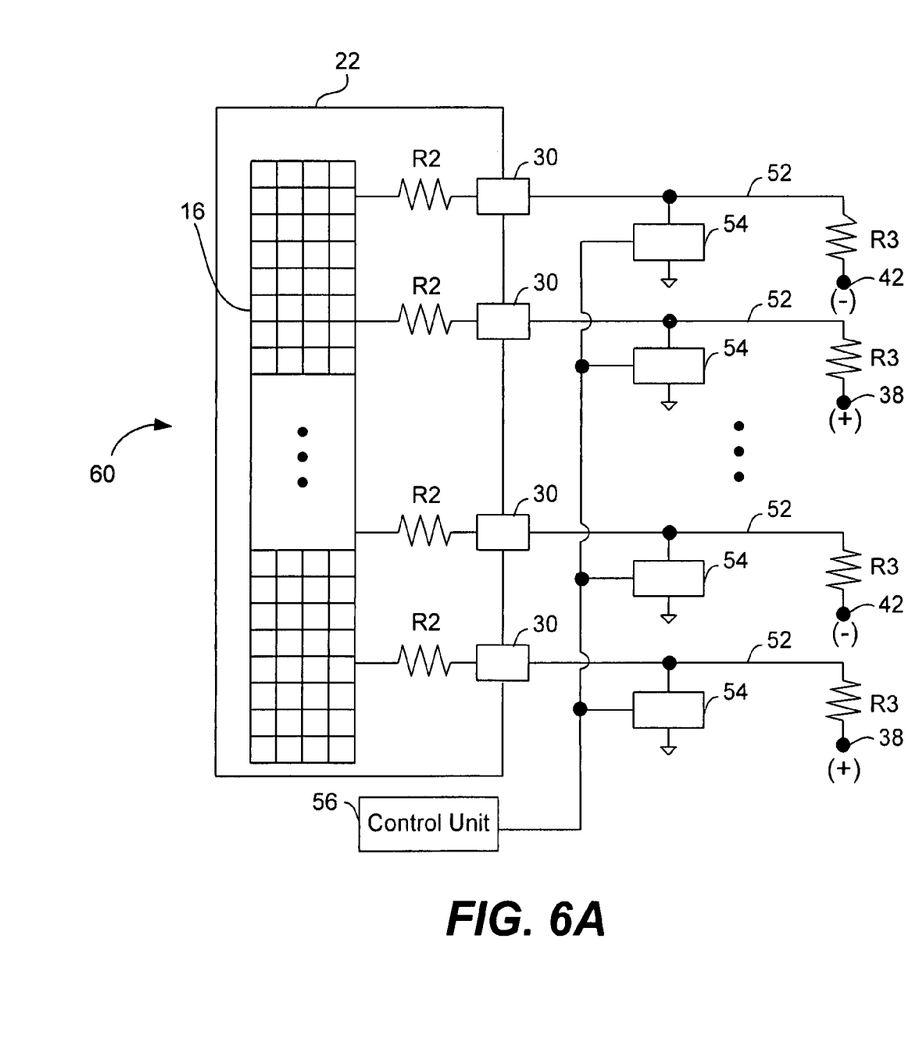
FIGS. 6A and 6B are diagrams of a test apparatus capable of implementing the test circuits of both FIGS. 2 and 3 for negative supply pins GND, VSS and/or VSSIO according to the present invention.

FIG. 6A is a diagram of a test apparatus 60 capable of performing both standard electrical testing of a chip as implemented by the circuitry of FIG. 2 as well as implementing the circuitry of FIG. 3 to facilitate the testing of individual bond wires on a chip for ground supplies (either VSS or VSS I/O). The test apparatus 60 is essentially the same as that illustrated in FIG. 5A. Accordingly, like elements are designated using the same reference numbers. The main difference between the two is that the switches 54 of FIG. 6A couple each conductor 52 to VSS when activated, as opposed to VDD. When the switches 54 are activated, each conductor 52 is connected to VSS and the chip 22 can be subject to electrical testing as described in relation to FIG. 2. On the other hand when the switches 54 are off, each conductor 52 is coupled to either the first terminal 38 or the second terminal 42 and the bond wire associated with each pin 30 can be tested as described above in relation to FIG. 3.

Figure 6B:
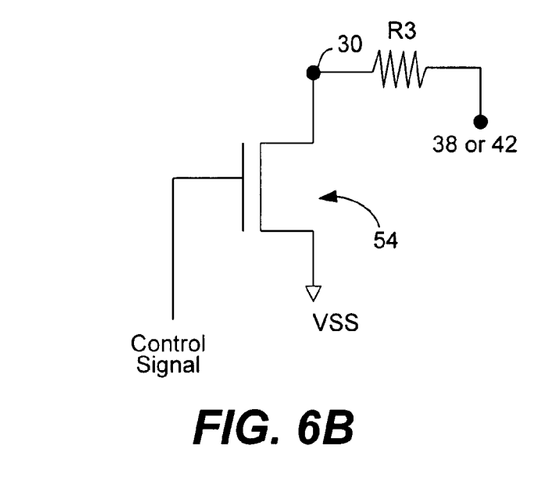

FIG. 6B is a diagram of the switch 54 used in FIG. 6A. In this figure, the upper terminal is connected to pin 30 and the other terminal is connected to VSS. The gate is connected to the control signal generated by the control unit 56. During the testing of the chip using the circuit of FIG. 2, each transistor 54 is turned on, pulling each pin 30 to ground or VSS. When the bond wires 22 are to be tested, each transistor 54 is turned off, connecting each pin to either the first terminal 38 or the second terminal 42.

It should be noted that for the sake of simplicity, the test apparatus 50 and 60 of FIGS. 5A and 6A are shown separately. It should be understood that in a preferred embodiment, similar circuitry would be implemented into a single system for testing all the power distribution grids (VDD, VDD IO, VSS, and VSS IO) into a single test apparatus.

Although the foregoing invention has been described in some detail for purposes of clarity of understanding, it will be apparent that certain changes and modifications may be practiced within the scope of the appended claims. Therefore, the described embodiments should be taken as illustrative and not restrictive, and the invention should not be limited to the details given herein but should be defined by the following claims and their full scope of equivalents.

I claim:

1. A method of individually testing power supply pins on a semiconductor die, comprising:

organizing the power pins of the die into a first group of power pins and a second group of power pins;

connecting each of the first group of power pins through a first set of resistors to a first common node respectively;

connecting each of the second group of power pins through a second set of resistors to a second common node respectively;

applying a voltage between the first and second nodes;

comparing the voltage measured at each of the power pins with a threshold voltage; and detecting a bad pin among the power pins based on the comparison.

2. The method of claim 1, further comprising providing a positive voltage to the first common node and ground to the second common node.

3. The method of claim 1, wherein the first set of resistors each have a resistive value larger than the resistive value of the first group of power pins respectively.

4. The method of claim 1, wherein the second set of resistors each have a resistive value larger than the resistive value of the second group of power pins respectively.

5. The method of claim 1, wherein comparing the voltage measured at each of the power pins with a threshold voltage and detecting a bad pin among the power pins based on the comparison for the first group of pins further comprises:

electrically connecting the pin in the first group of pins to a first input of a comparator;

electrically coupling a second input of the comparator to the first threshold voltage; and ascertaining that a wire bond associated with the pin is defective based on the comparison of the voltage on the first pin and the second pin of the comparator.

6. The method of claim 1, wherein comparing the voltage measured at each of the power pins with a threshold voltage and detecting a bad pin among the power pins based on the comparison for the second group of pins further comprises:
   electrically connecting the pin in the second group of pins to a first input of a comparator;
   electrically coupling a second input of the comparator to the second threshold voltage; and
   ascertaining that a wire bond associated with the pin is defective based on the comparison of the voltage on the pin compared to the second threshold voltage.

7. An apparatus for testing the individual power pins on an integrated circuit comprising:
   a first plurality of resistors coupled between a first group of power pins and a first node of the test apparatus;
   a second plurality of resistors coupled between a second group of power pins and a second node of the test apparatus;
   a voltage generator, coupled to the first node and the second node, and configured to apply a voltage across the first node and the second node; and
   a plurality of comparators, each coupled to one of the pins and a threshold voltage respectively.

8. The apparatus of claim 7, wherein the first plurality of resistors each have a resistive value greater than the resistive value of the wire bonds associated with the first group of pins respectively.

9. The apparatus of claim 7, wherein the second plurality of resistors each have a resistive value greater than the resistive value of the wire bonds associated with the second group of pins respectively.

10. The apparatus of claim 7, wherein a first subset of the comparators each has:
    a first input coupled to one of the pins of the first group; and
    a second input coupled to a first threshold voltage.

11. The apparatus of claim 7, wherein a second subset of the comparators each has:
    a first input coupled to one of the pins of the second group; and
    a second input coupled to a second threshold voltage.

12. The apparatus of claim 7, further comprising circuitry to test a plurality of the power pins on the integrated circuit and a switch to selectively activate either the apparatus for testing the individual pins on the integrated circuit or the circuitry to test the plurality of the power pins on the integrated circuit.

13. The method of claim 1, further comprising alternatively testing the plurality of power pins in the first group and the second group of power pins simultaneously to determine the overall functionality of the semiconductor die.

* * * * *